(12) United States Patent
Fetzer

(10) Patent No.: US 11,722,094 B2
(45) Date of Patent: Aug. 8, 2023

(54) FLEXIBLE CIRCUIT FOR SOLAR CELL ASSEMBLIES

(71) Applicant: The Boeing Company, Chicago, IL (US)

(72) Inventor: Christopher M. Fetzer, Chicago, IL (US)

(73) Assignee: The Boeing Company, Chicago, IL (US)

( * ) Notice: Subject to any disclaimer, the term of this patent is extended or adjusted under 35 U.S.C. 154(b) by 91 days.

(21) Appl. No.: 17/232,176

(22) Filed: Apr. 16, 2021

(65) Prior Publication Data

US 2022/0060145 A1 Feb. 24, 2022

Related U.S. Application Data

(60) Provisional application No. 63/068,840, filed on Aug. 21, 2020.

(51) Int. Cl.
*H02S 30/20* (2014.01)
*H01L 31/02* (2006.01)
*H01L 31/05* (2014.01)

(52) U.S. Cl.
CPC ........ *H02S 30/20* (2014.12); *H01L 31/02021* (2013.01); *H01L 31/0512* (2013.01)

(58) Field of Classification Search
CPC ........... H01L 31/02021; H01L 31/0512; H01L 31/0504; H01L 31/0508; H02S 30/20
See application file for complete search history.

(56) References Cited

U.S. PATENT DOCUMENTS 4,019,924 A * 4/1977 Kurth .................. H01L 31/0512
                                                                            136/251
4,227,298 A * 10/1980 Keeling .............. H01L 31/0508
                                                                            206/487

(Continued)

FOREIGN PATENT DOCUMENTS

| GB | 2040562 A | * | 8/1980 | ......... H01L 31/0508 |
| JP | 2018078276 A | * | 5/2018 | ....... H01L 31/02021 |
| WO | WO-2015012697 A1 | * | 1/2015 | ......... H01L 31/0516 |

OTHER PUBLICATIONS

JP-2018078276-A English machine translation (Year: 2018).*

(Continued)

*Primary Examiner* — Andrew J Golden
(74) *Attorney, Agent, or Firm* — McDonnell Boehnen Hulbert & Berghoff LLP

(57) ABSTRACT

A solar cell assembly having a flexible circuit is described. The solar cell assembly includes a solar cell having a solar-facing surface and a non-solar-facing surface, the solar cell comprising a cell corner. The solar cell assembly further includes a flexible circuit coupled to the non-solar-facing surface of the solar. The flexible circuit is substantially coextensive with the solar cell. The flexible circuit includes a flexible insulator including a plurality of edges aligned with the solar cell, a flexible corner extending past the cell corner, and a flexible tab extending from an edge of the plurality of edges. The flexible circuit includes a circuit substantially embedded in the flexible insulator. The circuit comprises a first electric contact exposed at a solar-facing side of the flexible corner, and a second electric contact exposed at a solar-facing side of the flexible tab.

20 Claims, 7 Drawing Sheets

(56) References Cited

U.S. PATENT DOCUMENTS

| | | | | |
|---|---|---|---|---|
| 5,567,248 | A | * 10/1996 | Chung | H01L 31/0504 |
| | | | | 136/244 |
| 6,156,967 | A | * 12/2000 | Ralph | H01L 31/041 |
| | | | | 136/244 |
| 6,531,653 | B1 | * 3/2003 | Glenn | H01L 31/042 |
| | | | | 136/246 |
| 2012/0024342 | A1 | * 2/2012 | Kalman | H02S 30/20 |
| | | | | 136/245 |
| 2018/0076339 | A1 | 3/2018 | Rehder | |
| 2018/0076344 | A1 | 3/2018 | Rehder | |
| 2018/0076346 | A1 | 3/2018 | Rehder | |
| 2018/0076348 | A1 | 3/2018 | Rehder | |
| 2018/0076349 | A1 | 3/2018 | Rehder | |
| 2018/0076350 | A1 | 3/2018 | Rehder et al. | |
| 2018/0076761 | A1 | 3/2018 | Rehder | |
| 2018/0358491 | A1 | 12/2018 | Rehder | |
| 2018/0358497 | A1 | 12/2018 | Rehder | |
| 2019/0305719 | A1 | 10/2019 | Rehder | |
| 2019/0305723 | A1 | 10/2019 | Rehder | |

OTHER PUBLICATIONS

Erik Edqvist et al., "Evaluation of building technology for mass producible millimetre-sized robots using flexible printed circuit boards", Journal of Micromechanics and Microengineering, Institute of Physics Publishing, Bristol GB, vol. 19, No. 7, (2009).
Extended European Search Report prepared by the European Patent Office in application No. EP 21 19 0498.2 dated Jan. 19, 2022.

* cited by examiner

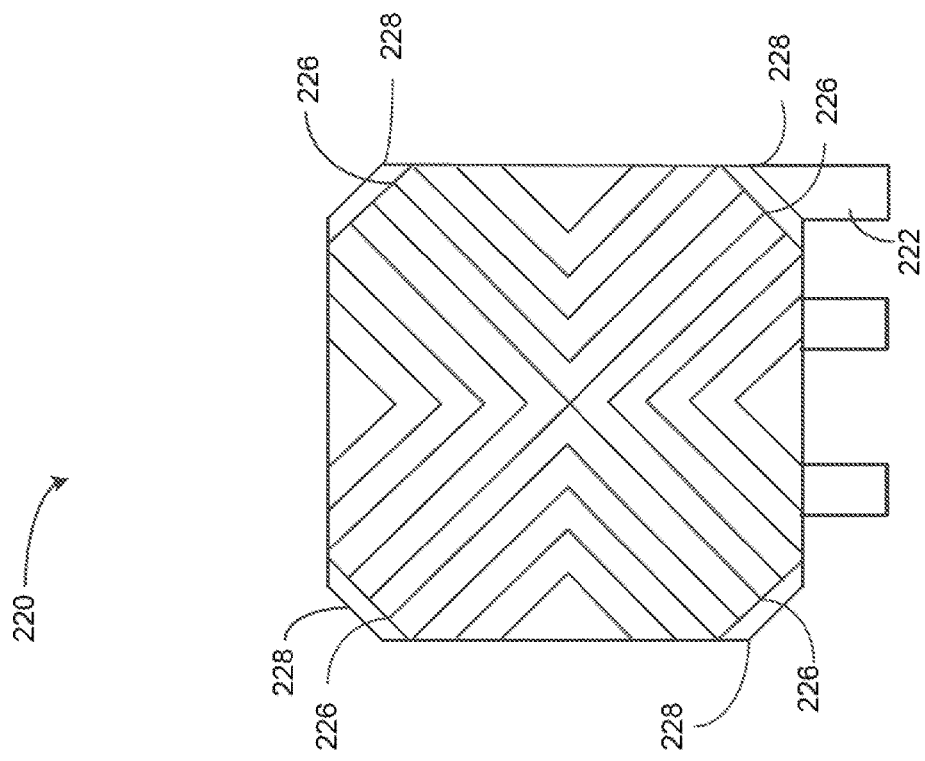
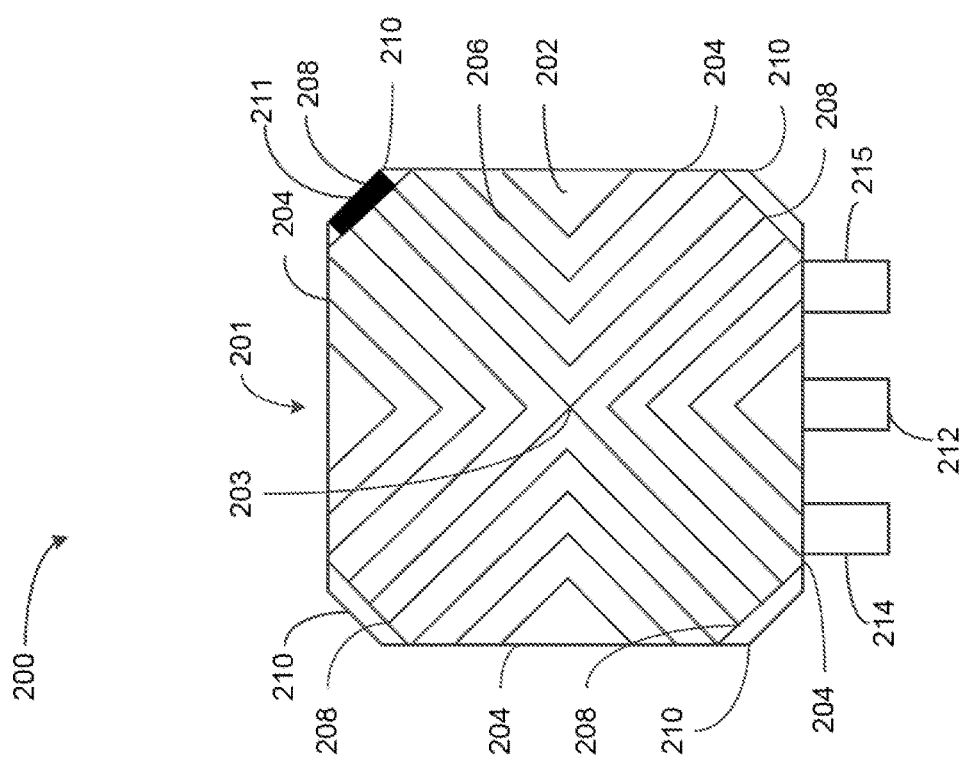

FLEXIBLE CIRCUIT FOR SOLAR CELL ASSEMBLIES

CROSS-REFERENCE TO RELATED APPLICATIONS

This application claims priority to U.S. Provisional Patent Application No. 63/068,840, filed Aug. 21, 2020, which is incorporated by reference in its entirety and for all purposes.

FIELD

The present disclosure relates generally to a solar cell assembly. In particular, the present disclosure relates to a flexible circuit used with a solar cell assembly.

BACKGROUND

Solar cells are used to transform heat energy from sunlight into electrical energy. In order to increase the energy output of a solar cell system, a plurality of solar cells can be interconnected. The solar cells are typically modular to facilitate adaptive configurations.

Assembling the solar cells into a single system can involve multiple components and several steps. In particular, assembling the solar cells can include welding several different types of interconnects between adjacent solar cells and covering the interconnected solar cells in an enclosure. These steps may be impractical at some facilities, and may require pre-assembly, by a manufacturer, increasing handling costs and reducing flexibility for an end user of the system of solar cells.

What is needed is a solar cell assembly that allows for consistent and timely assembly of a system of solar cells.

SUMMARY

In an example, a solar cell assembly having a flexible circuit is described. The solar cell assembly includes a solar cell having a solar-facing surface and a non-solar-facing surface, the solar cell comprising a cell corner. The solar cell assembly further includes a flexible circuit coupled to the non-solar-facing surface of the solar cell, wherein the flexible circuit is substantially coextensive with the solar cell. The flexible circuit comprises a flexible insulator comprising a plurality of edges aligned with the solar cell, a flexible corner extending past the cell corner, and a flexible tab extending from an edge of the plurality of edges, and a circuit substantially embedded in the flexible insulator, wherein the circuit comprises a first electric contact exposed at a solar-facing side of the flexible corner, and a second electric contact exposed at a solar-facing side of the flexible tab.

In another example, flexible circuit for a solar cell assembly is described. The flexible circuit comprises a plurality of edges, wherein the plurality of edges are configured to align with a solar cell such that the flexible insulator is coextensive with the solar cell. The flexible circuit comprises a flexible corner, wherein the flexible corner is configured to extent past a cell corner of the solar cell. The flexible circuit comprises a flexible tab extending from an edge of the plurality of edges. The flexible circuit comprises a circuit substantially embedded in the flexible insulator, wherein the circuit comprises a first electric contact exposed at a solar-facing side of the flexible corner, and a second electric contact exposed at a solar-facing side of the flexible tab.

In another example, system of solar cells having flexible circuits is described. The system includes a plurality of solar cell assemblies. Each solar cell assembly comprises a solar cell having a solar-facing surface and a non-solar-facing surface, the solar cell comprising a cell corner. Each solar cell assembly comprises a flexible circuit coupled to the non-solar-facing surface of the solar cell, wherein the flexible circuit is substantially coextensive with the solar cell. The flexible circuit comprises a flexible insulator comprising a plurality of edges aligned with the solar cell, a flexible corner extending past the cell corner, and a flexible tab extending from an edge of the plurality of edges, and a circuit substantially embedded in the flexible insulator, wherein the circuit comprises a first electric contact exposed at a solar-facing side of the flexible corner, and a second electric contact exposed at a solar-facing side of the flexible tab. The plurality of solar cells assemblies comprises at least one pair of adjacent solar cell assemblies comprising a first solar cell assembly electrically coupled to a second solar cell assembly via the first electric contact and the second electric contact.

The features, functions, and advantages that have been discussed can be achieved independently in various examples or may be combined in yet other examples. Further details of the examples can be seen with reference to the following description and drawings.

BRIEF DESCRIPTION OF THE FIGURES

The novel features believed characteristic of the illustrative examples are set forth in the appended claims. The illustrative examples, however, as well as a preferred mode of use, further objectives and descriptions thereof, will best be understood by reference to the following detailed description of an illustrative example of the present disclosure when read in conjunction with the accompanying drawings, wherein:

FIG. 2A illustrates a top view of a solar cell assembly, according to an example implementation.

FIG. 2B illustrates a top view of another solar cell assembly, according to an example implementation.

DETAILED DESCRIPTION

Figure 1A:
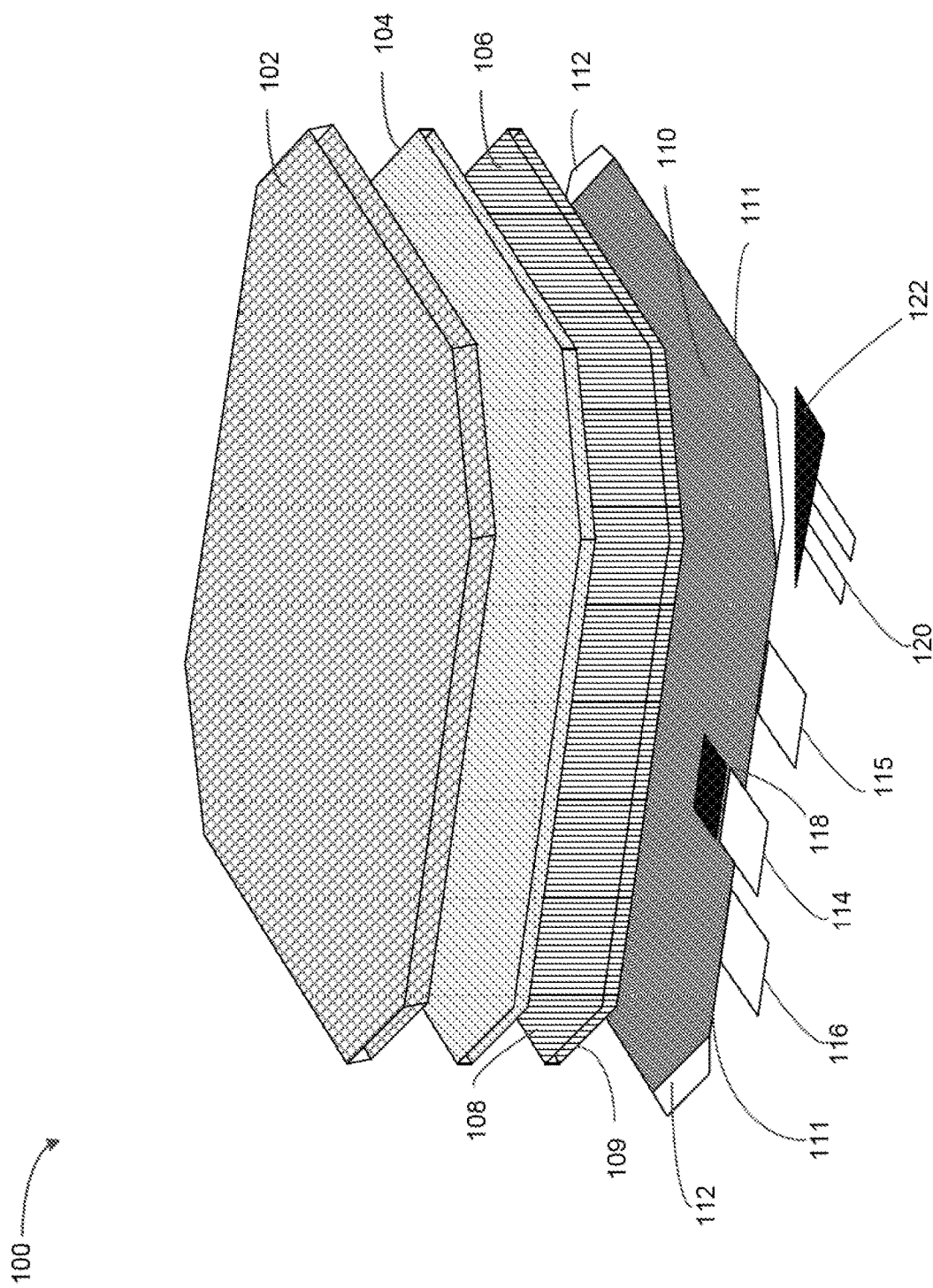
FIG. 1A illustrates an exploded view of a solar cell assembly, according to an example implementation.

Disclosed examples will now be described more fully hereinafter with reference to the accompanying drawings, in which some, but not all of the disclosed examples are shown. Indeed, several different examples may be described and should not be construed as limited to the examples set forth herein. Rather, these examples are described so that this disclosure will be thorough and complete and will fully convey the scope of the disclosure to those skilled in the art.

Example solar cell assemblies and systems of solar cells are described. Within examples, a solar cell assembly is described that includes a flexible circuit. The flexible circuit includes a flexible insulator and a circuit substantially embedded in the flexible insulator. In the examples described herein, the circuit being "substantially embedded" in the flexible insulator refers to metal traces of the circuit being surrounded by the flexible insulator and other aspects of the circuit (e.g., electric contacts) being exposed. For example, the flexible insulator may have a top layer and a bottom layer, and the metal traces may be sandwiched between the top layer and the bottom layer, while the other aspects are disposed on the bottom layer without being covered by the top layer. The aspects of the circuit that are exposed allow contacts between adjacent solar cells in a system of solar cells. Including an individual flexible circuit for each solar cell assembly in a system of solar cells may ease manufacturing and increase flexibility of final system design by reducing the amount of welding involved in assembly.

Within examples, the flexible circuit is attached on a non-solar-facing surface of the solar cell to in order to reduce shadowing on the solar-facing side and thereby allow for additional power output by the solar cell assembly.

Within examples, the flexible circuit includes a flexible insulator with a plurality of openings configured to permit one or more tabs of an adjacent flexible circuit to contact a non-solar-facing surface of a solar cell. Because the flexible insulator includes a plurality of openings, each corresponding to a different edge of the solar cell, adjacent solar cells can be connected in different orientations other than a straight string of solar cells. This allows for an adaptive and modular system of solar cells. As used herein in the context of solar cells, the term "adjacent" refers to solar cells that are aligned next to one another with no intermediate solar cells in-between them.

Within examples, the flexible circuit includes a plurality of contacts disposed at a plurality of corners of a solar cell. Because the contacts are disposed at multiple positions at the edge of the cells, electric leads on the solar-facing surface of the solar cell can be shortened, thereby reducing resistive losses in a system of solar cells.

Within examples, corners of the flexible circuit can be folded towards a solar-facing surface of the solar cell to make contact with one or more leads, thereby reducing the number of individual parts required in a system of solar cells and reducing an amount of welding during assembly.

Thus, examples are provided herein that generally facilitate quick, robust, and adaptive assembly of systems of solar cells. These systems can be implemented by incorporating a flexible circuit into individual solar cell assemblies, as described further below.

Turning now to the figures, FIG. 1A illustrates an exploded view of a solar cell assembly 100, according to an example implementation. The solar cell assembly includes an enclosure 102 (e.g., a coverglass), an adhesive 104, a solar cell 106 coupled to the enclosure 102 via the adhesive 104, and a flexible circuit 110 coupled to the solar cell 106. The solar cell 106 includes a solar-facing surface 108 and a non-solar-facing surface 109 disposed on an opposite side from the solar-facing surface 108. In this context, "solar-facing" refers to a portion of a solar cell assembly that faces a light source, such as the sun. In the illustrated example, the solar cell 106 has four cropped cell corners. The flexible circuit 110 is coupled to the non-solar-facing surface 109 of the solar cell 106. Attaching the flexible circuit to the non-solar-facing surface 109 of the solar cell 106 allows for fewer electrical components to be positioned on the solar-facing surface 108 of the solar cell 106, which may reduce shadowing of the cell and may additionally reduce resistive losses on the solar-facing surface 108 of the solar cell 106.

The flexible circuit 110 includes a plurality of edges 111 that are aligned with the solar cell 106. Further, the flexible circuit 110 is substantially coextensive with the solar cell 106 such that only some portions of the flexible circuit 110 extend past the solar cell 106. The flexible circuit 110 includes a plurality of flexible corners 112, a first tab 114 associated with a bypass diode 118, a second tab 115 associated with one or more metal traces (not shown) in the flexible circuit 110, and a third tab 116 associated with one or more other metal traces (not shown) in flexible circuit 110. As depicted in FIG. 1A, the bypass diode 118 is embedded in the flexible circuit 110. FIG. 1A also shows an alternate example in which a bypass diode 122 and a corresponding flexible tab 120 are connected to a flexible corner of the flexible circuit 110. This illustrates that having a plurality of contacts at a plurality of flexible corners 112 in the flexible circuit 110 allows for an adaptive and robust configuration of the solar cell assembly 100.

Figure 1B:
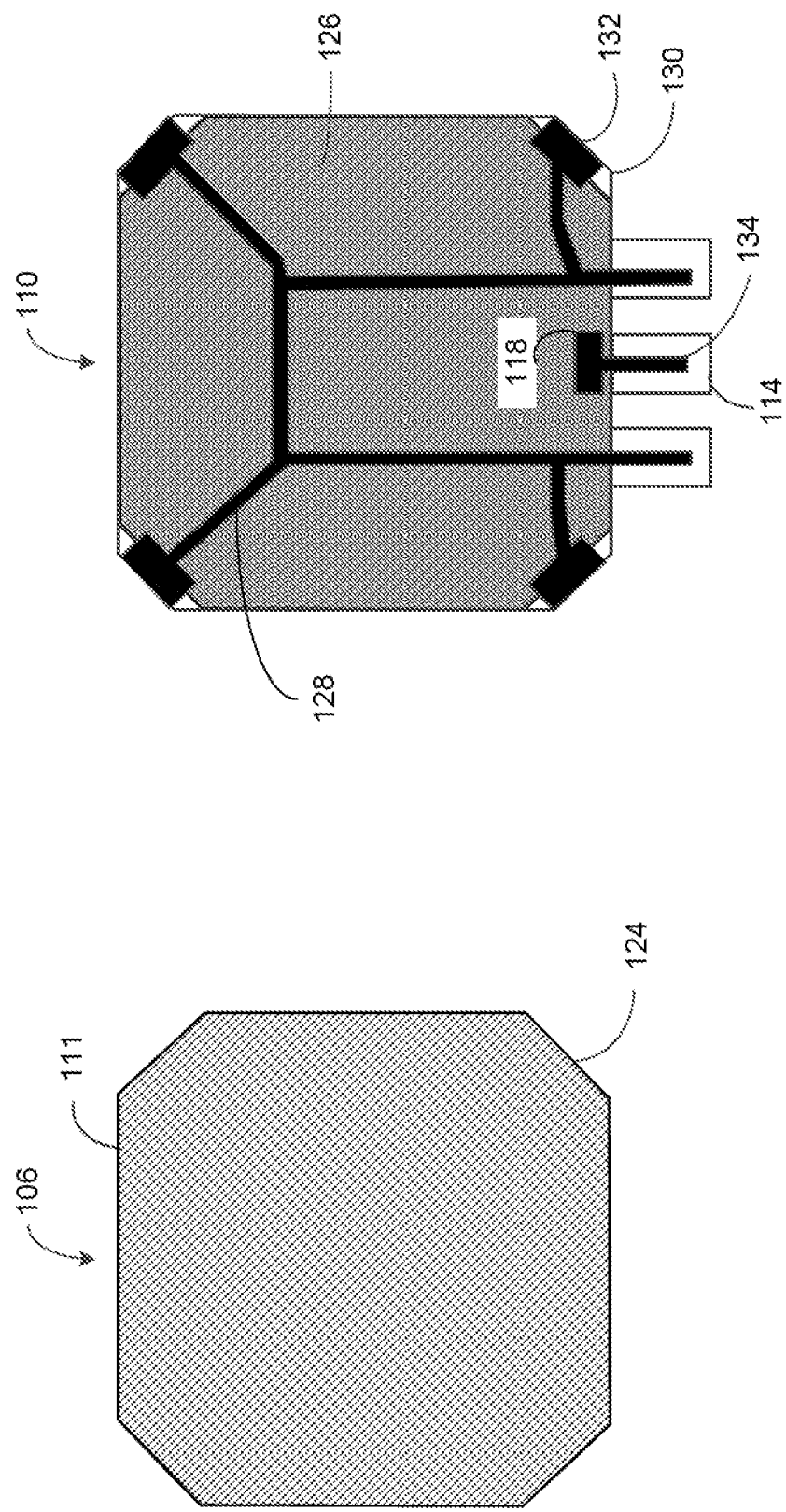
FIG. 1B illustrates a side-by-side view of a solar cell and a flexible circuit in the solar cell assembly, according to an example implementation.

FIG. 1B illustrates a side-by-side view of the solar cell 106 and the flexible circuit 110 in the solar cell assembly 100, according to an example implementation. In particular, FIG. 1B shows the flexible circuit 110 including a flexible insulator 126 and a circuit 128 embedded in the flexible insulator 126. The circuit 128 includes the bypass diode 118, and a plurality of electric contacts. The electric contacts include a first contact 130 disposed in a first flexible corner 132 of the plurality of flexible corners 112, and a second contact 134 disposed in the first flexible tab 114.

FIG. 1B illustrates that each of the flexible corners 112 extends past a cropped corner 124 on the solar cell 106. This allows for the electric contacts in the circuit 128 to be exposed at each cell corner of each solar cell assembly in a system, easing connections between adjacent solar cells. FIG. 1B further shows that the solar cell 106 is square with four cropped cell corners and the flexible circuit 110 is square with four cropped flexible corners. The cropped flexible corners of the flexible circuit 110 each extend past the cropped cell corners of the solar cell 106. This configuration may increase the number of configurations that are possible in a system of solar cells. For example, because each edge of the solar cell 106 is the same length, each solar cell assembly can be rotated relative to other solar cell assemblies while still being aligned with the other solar cell assemblies.

FIG. 2A illustrates a top view of a solar cell assembly 200, according to an example implementation. The solar cell assembly 200 includes a solar cell 201 having a solar-facing surface 202 and a non-solar-facing surface (not shown). The solar-facing surface 202 is a portion of the solar cell assembly 200 directed towards a light source and configured to translate light energy into electric power. A non-solar-facing surface is a surface disposed opposite the solar-facing surface. The solar cell assembly 200 includes a plurality of edges 204 and a plurality of electric leads 206 disposed on the solar-facing surface 202 and configured to conduct electricity generated by the solar cell assembly 200. The solar cell assembly 200 further includes a plurality of cell corners 208 that join edges of the solar cell 201 together. As shown in FIG. 2A, the cell corners 208 are truncated to form cropped cell corners. The cropped cell corners allow for space between adjacent cells in a system of solar cells to form connections.

As shown in FIGS. 1A and 1B, a flexible circuit in the solar cell assembly 200 is substantially coextensive with the solar cell 201. Accordingly, only portions of a flexible circuit are depicted in FIG. 2A. In particular, FIG. 2A shows a plurality of flexible corners 210 that extend past the cell corners 208. The flexible circuit also includes a plurality of tabs including a first flexible tab 212 associated with a bypass diode of the flexible circuit, a second flexible tab 214 associated with one or more metal traces within the flexible circuit, and a third flexible tab 215 associated with one or more other metal traces within the flexible circuit. Further details regarding the metal traces and the plurality of tabs are described further below with respect to FIG. 3 and FIG. 4.

Each of the flexible corners 210 may include an electric contact used for connecting with other components in a system of solar cells, such as adjacent solar cells. By way of example, a first electric contact 211 of a plurality of electric contacts is depicted in FIG. 6A (other electric contacts omitted for simplicity). As shown in FIG. 2A, the solar-facing surface 202 of the solar cell includes a center portion 203, and a plurality of electric leads 206 extend from the center portion 203 towards the first electric contact 211. Within examples, as shown in FIG. 2A, the electric leads 206 may extend towards each of a plurality of electric contacts in the flexible corners 210. The electric leads 206 extending from the center portion 203 allows a reduction in length of the electric leads 206 relative to, for example, leads that extend across the entirety of the solar cell 201. This may reduce resistive losses when transferring electricity across the electric leads 206.

FIG. 2B illustrates a top view of another solar cell assembly 220, according to an example implementation. The solar cell assembly 220 depicts an alternative configuration of the flexible circuit in which the first flexible tab 222 is disposed at a cropped flexible corner of a plurality of cropped flexible corners 228, which extend past a plurality of cropped cell corners 226. Accordingly, in the example shown in FIG. 2B, a bypass diode can be placed at a flexible corner rather than within the flexible circuit. This may further ease assembly of the solar cell assembly or a system of solar cell assemblies.

Figure 3:
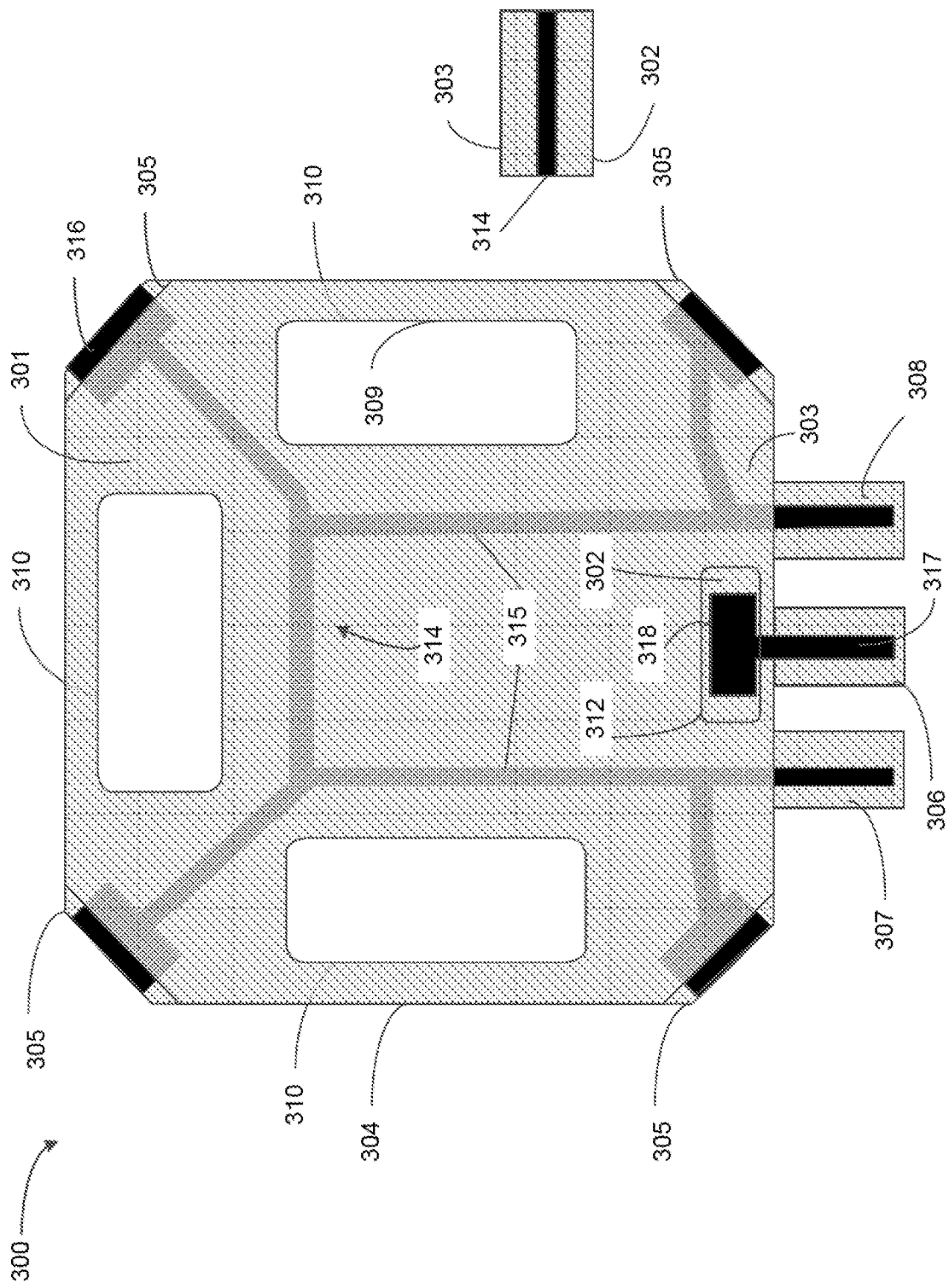
FIG. 3 illustrates a flexible circuit, according to an example implementation.

FIG. 3 illustrates a flexible circuit 300, according to an example implementation. The flexible circuit 300 includes a flexible insulator 301, such as a Polyimide material. Other types of flexible insulators are possible. The flexible insulator 301 includes a bottom layer 302 and a top layer 303 and aspects of an electric circuit can be disposed between the bottom layer 302 and the top layer 303. The flexible insulator 301 includes a plurality of edges 304, a plurality of flexible corners 305, a first flexible tab 306, a second flexible tab 307, and a third flexible tab 308. The flexible insulator 301 further includes a plurality of openings 310 that are configured to interface with one or more flexible tabs of an adjacent flexible circuit, and a partial opening 312. The partial opening 312 includes a portion of the bottom layer 302 and does not include the top layer 303. The bottom layer 302 may correspond to a bottom of a solar cell assembly and the top layer 303 may be attached to a non-solar-facing surface of a solar cell. In this manner, the partial opening 312 may insulate an electric component on one side, but allow the electric component to contact a solar cell. In the example illustrated in FIG. 3, a bypass diode 318 is partially embedded in the flexible insulator 301, and may contact a non-solar-facing surface of the solar cell.

As shown in FIG. 3, the flexible insulator 301 is configured such that the edges 304 are configured to align with a solar cell such that the flexible insulator 301 is coextensive with the solar cell. This allows a solar assembly including the solar cell and the flexible circuit 300 to interface efficiently with other solar cell assemblies in a system of solar cells.

The flexible insulator includes an opening 309 that exposes a portion of a non-solar-facing surface of a solar cell that is attached to the flexible circuit 300. The opening 309 is a first opening of the plurality of openings 310. As described above, the opening 309 is configured to accept an adjacent flexible tab of an adjacent flexible circuit, thereby allowing the adjacent flexible circuit to connect to the solar cell attached to the flexible circuit 300. In this manner, the opening 309 reduces the need for non-solar-facing welding for a system of solar cells. Further, as shown in FIG. 3, each opening of the plurality of openings 310 corresponds to a different edge of the flexible insulator 301. This allows for the solar cell assembly to be oriented in different directions relative to other solar cell assemblies, allowing for a more adaptive and simple assembly process. For example, the solar cell assemblies can be assembled into solar strings (e.g., a plurality of series-connected solar cells) that are oriented in a non-linear manner.

The flexible circuit 300 further includes a circuit 314 that is substantially embedded in the flexible insulator 301. The circuit 314 includes a one or more metal traces 315, a plurality of electric contacts that are exposed on at least one side, and the bypass diode 318. In the illustrated example, the flexible circuit 314 is substantially embedded in the flexible insulator 301 because the metal traces 315 are surrounded by the flexible insulator 315, but the electric contacts and the bypass diode 318 are exposed. For example, the plurality of contacts in FIG. 3 include a first electric contact 316 exposed at a solar facing side of a flexible corner and a second electric contact 317 exposed at a solar-facing side of a flexible tab.

As described with respect to the flexible insulator 301, the flexible circuit 300 includes a plurality of tabs, including the first flexible tab 306, and the first flexible tab 306 is associated with a bypass diode 318 of the circuit 314. Further, the second flexible tab 307 of the plurality of tabs is configured to provide a current path between the solar cell and an adjacent solar cell. In the example illustrated in FIG. 3, each of the plurality of tabs extends from a same edge of the flexible insulator 301. This allows each tab to connect with the same adjacent solar cell, and further allows more edges available for the plurality of openings 310.

As described above, the bypass diode 318 for a solar cell (e.g., the solar cell 106) is partially embedded in the partial opening 312. In the partial opening 312, the top layer 303 includes an opening, and the bypass diode 318 is configured to contact a non-solar-facing surface of the solar cell via the opening. The bottom layer 302 corresponds to a bottom of a solar cell assembly and the top layer 303 is attached to a non-solar-facing surface of a solar cell when manufacturing a solar cell assembly. In this manner, the partial opening 312 insulates the bypass diode 318 on one side, but allows the bypass diode to contact the solar cell. In this manner, the bypass diode 318 can be installed in the solar cell assembly simultaneously with other portions of the circuit 314.

The first electric contact 316 is configured to connect to another component in a system of solar cells. For example, the first electric contact 316 may be connected via an interconnect to one or more electric leads of an adjacent solar cell. The second electric contact 317 is connected to the bypass diode 318, and the bypass diode 318 is configured to contact a non-solar-facing surface of another solar cell (e.g., an adjacent solar cell) via the second electric contact 317. In this manner, the first flexible tab 306 allows for a simple-to-install connection between a bypass diode embedded in a first solar cell assembly and a non-solar-facing surface of an adjacent solar cell assembly.

Within examples, the solar cell (e.g., the solar cell 106) includes an n-side associated with negative doping and a p-side associated with positive doping. The first electric contact 316 and associated metal traces may correspond to the n-side, and the second electric contact 317 may correspond to the p-side. Further, electric contacts at the second flexible tab 307 and the third flexible tab 308 may correspond to the n-side. The flexible tabs are configured to contact a non-solar-facing side of an adjacent solar cell, while the flexible corners 305 are configured to contact other components on a solar-facing side of the flexible circuit 300. Accordingly, the example depicted in FIG. 3 includes n-type electric contacts configured for solar-facing connections and non-solar-facing connections and p-type electric contacts configured only for non-solar-facing connections.

Within examples all circuitry for a solar cell assembly is included in the flexible circuit 300. This may simplify and expedite assembly, but also may allow for testing and troubleshooting of the circuitry on the flexible circuit 300 prior to assembly.

Figure 4:
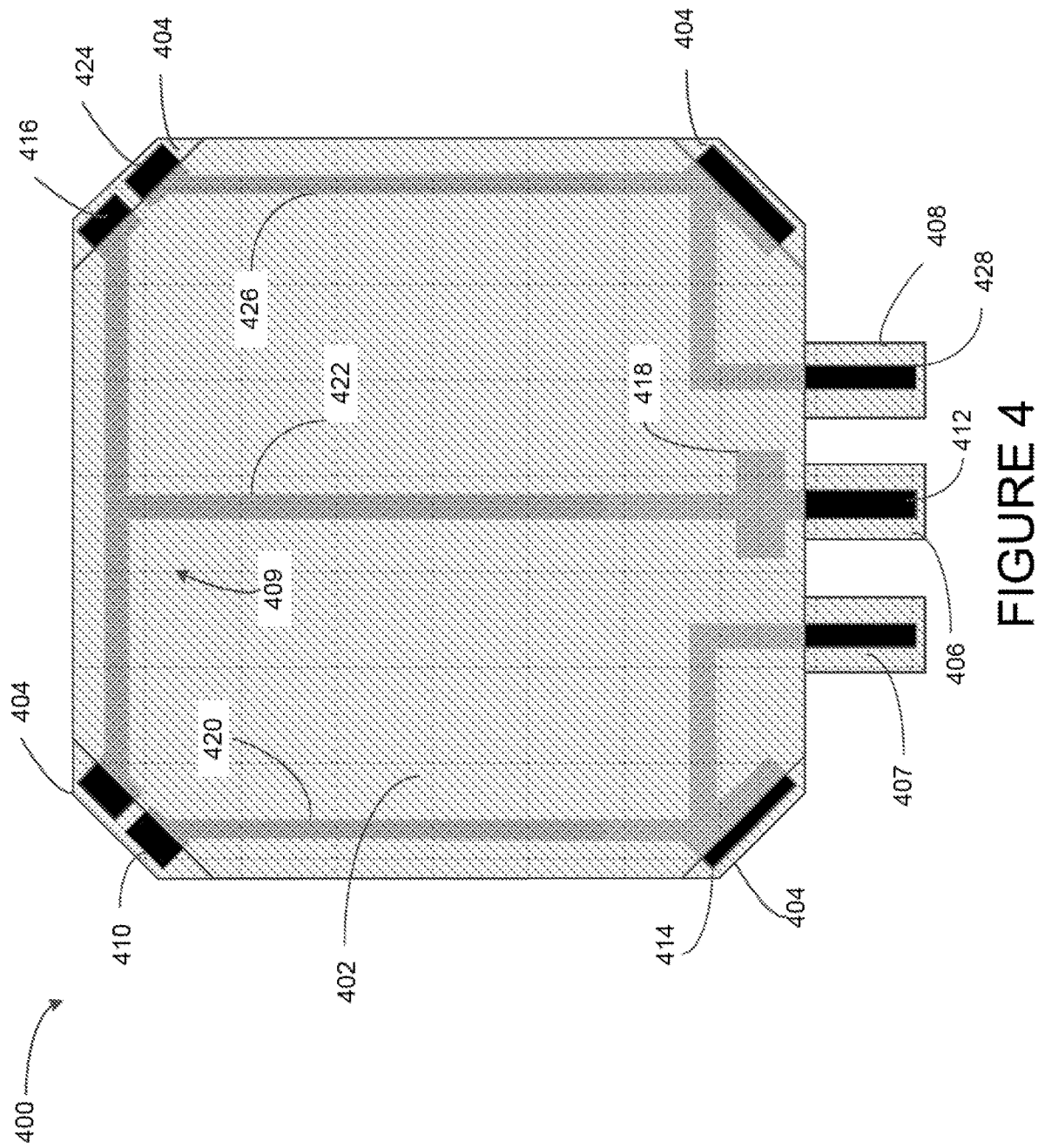
FIG. 4 illustrates a flexible circuit, according to another example implementation.

FIG. 4 illustrates a flexible circuit 400, according to another example implementation. The flexible circuit 400 includes a flexible insulator 402, such as a Polyimide material. The flexible insulator 402 includes a plurality of cropped flexible corners 404, a first flexible tab 406, a second flexible tab 407, and a third flexible tab 408. In particular, FIG. 4 shows the flexible insulator 402 is rectangular (for example, square-shaped) with four cropped flexible corners. As described above, this allows the flexible circuit 400 to align with and to be coextensive with a similarly shaped solar cell. Unlike the example depicted in FIG. 3, the flexible insulator 402 does not include a plurality of openings that are configured to interface with one or more flexible tabs of an adjacent flexible circuit. Rather, additional contacts are provided on a solar-facing side of the flexible circuit 400.

The flexible circuit 400 further includes a circuit 409 that is substantially embedded in the flexible insulator 402. The circuit 409 includes a first electric contact 410 disposed at a first cropped flexible corner and a second electric contact disposed at the first flexible tab 406, a third electric contact 414 disposed at a second cropped flexible corner, a fourth electric contact 416 disposed at a third cropped flexible corner, a fifth electric contact 424 disposed at the third cropped flexible corner, and a sixth electric contact 428 disposed at the third flexible tab 408. Other electric contacts are unlabeled for purposes of simplicity.

The circuit 409 further includes a first metal trace 420 providing a current path between the first electric contact 410 and the third electric contact 414. This current path further corresponds to the second flexible tab 407. The circuit 409 further includes bypass diode 418 embedded in the flexible insulator 401, and a second metal trace 422 providing a current path between the second electric contact 412 and the fourth electric contact 416 via the bypass diode 418. The circuit 409 further includes a third metal trace 426 providing a current path between the fifth electric contact 424 and the sixth electric contact 428.

Similarly to the example illustrated in FIG. 3, the flexible circuit 400 is configured to interface with a solar cell and at least one adjacent solar cell. A solar cell includes an n-side associated with negative doping and a p-side associated with positive doping. The first electric contact 410, the third electric contact 414, the fifth electric contact 424, and the sixth electric contact 428 may correspond to the n-side, and the second electric contact 412 and the fourth electric contact 416 may correspond to the p-side. The flexible tabs are configured to contact a non-solar-facing side of an adjacent solar cell, while the cropped flexible corners 404 are configured to contact other components on a solar-facing side of the flexible circuit 400. Accordingly, the example depicted in FIG. 4 includes n-type electric contacts configured for both solar-facing connections (e.g., the first electric contact 410, the third electric contact 414, and the fifth electric contact 424) and non-solar-facing connections (e.g., the sixth electric contact 428) and p-type electric contacts configured for both solar facing connections (e.g., the fourth electric contact 416) and non-solar-facing connections (e.g., the second electric contact 412).

As shown in FIG. 4, the fourth electric contact 416 and the fifth electric contact 424 are disposed at the same cropped flexible corner, and each corresponds to a different metal trace. Accordingly, within examples, a single flexible corner may include a plurality of electric contacts. This may allow the bypass diode 418 to be accessed in a more adaptive manner when manufacturing a system of solar cells.

Figure 5B:
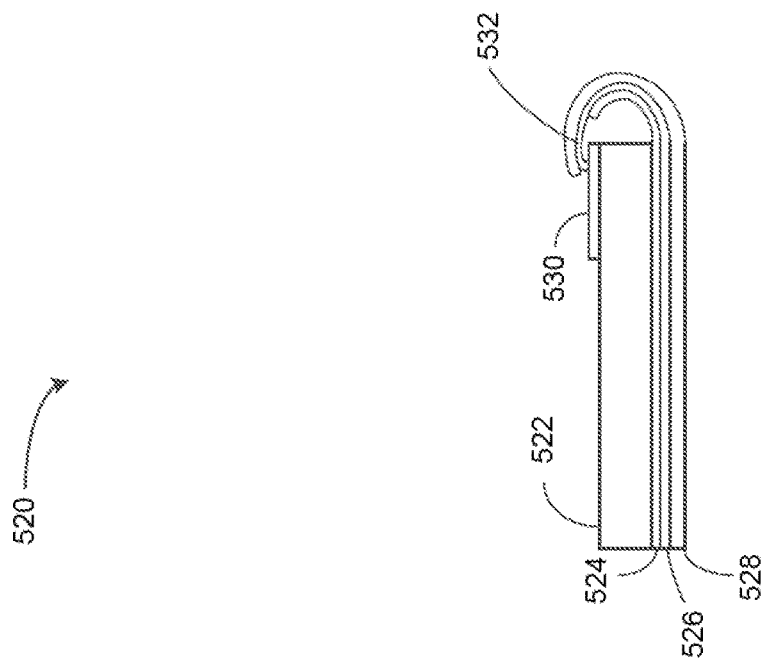
FIG. 5B illustrates another corner of a solar cell assembly, according to another example implementation.
Figure 5A:
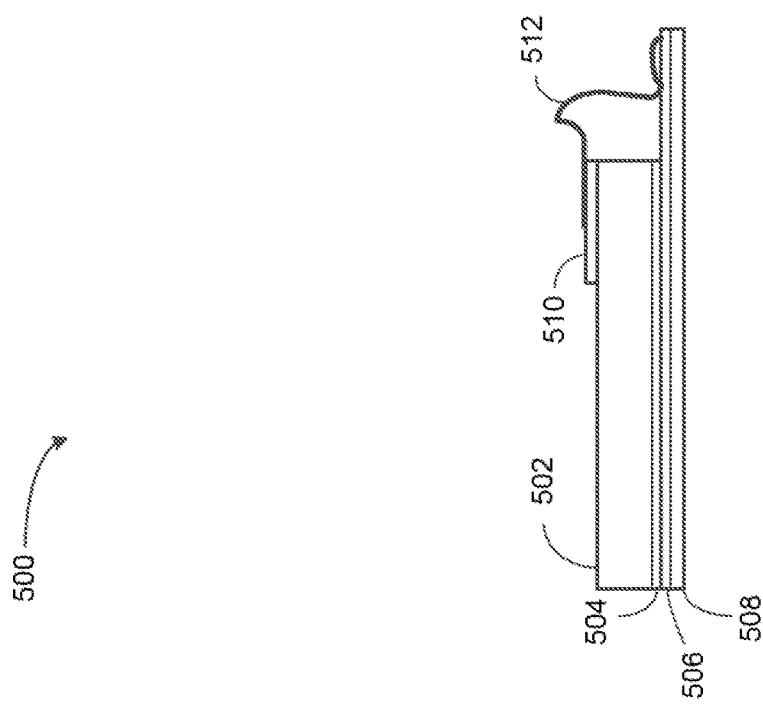
FIG. 5A illustrates a corner of a solar cell assembly, according to an example implementation.

FIG. 5A illustrates a corner 500 of a solar cell assembly, according to an example implementation. The corner 500 includes a cell corner 502, a top layer 504 of a flexible circuit, an electric contact 506 of a flexible circuit, and a bottom layer 508 of the flexible circuit. One or more electric leads 510 are disposed on a solar-facing surface of the cell corner 502, and an interconnect 512 is provided that connects the electric contact 506 with the one or more electric leads 510. The interconnect 512 can be welded or ribbon bonded to the electric contact 506 and the one or more electric leads 510 or a terminal of the one or more electric leads, for example.

The electric contact 506 may be a first electric contact of a plurality of electric contacts. Within examples, the interconnect 512 can be a wire bonded between the one or more electric leads 510 on the solar-facing surface of the solar cell and the first electric contact.

FIG. 5B illustrates another corner 520 of a solar cell assembly, according to another example implementation. The corner 520 includes a cell corner 522, a top layer 524 of a flexible circuit, an electric contact 526 of the flexible circuit, and a bottom layer 528 of the flexible circuit. The electric contact 526 may be a first electric contact of a plurality of electric contacts. The flexible circuit has a flexible corner 532 that is configured to bend such that the first electric contact is configured to couple to one or more electric leads 530 on a solar-facing surface of the solar cell. In particular, the electric contact 526 bends towards the one or more electric leads 530. By having a flexible corner 532 that extends past the corner 520, the flexible circuit can reduce the number of components in the system. For example, the interconnect 512 shown in FIG. 5A is not included in FIG. 5B because the flexible corner 532 is configured to bend toward the solar-facing surface of the solar cell. Connecting the electric contact 526 to the one or more electric leads may include soldering the electric contact 526.

Figure 6:
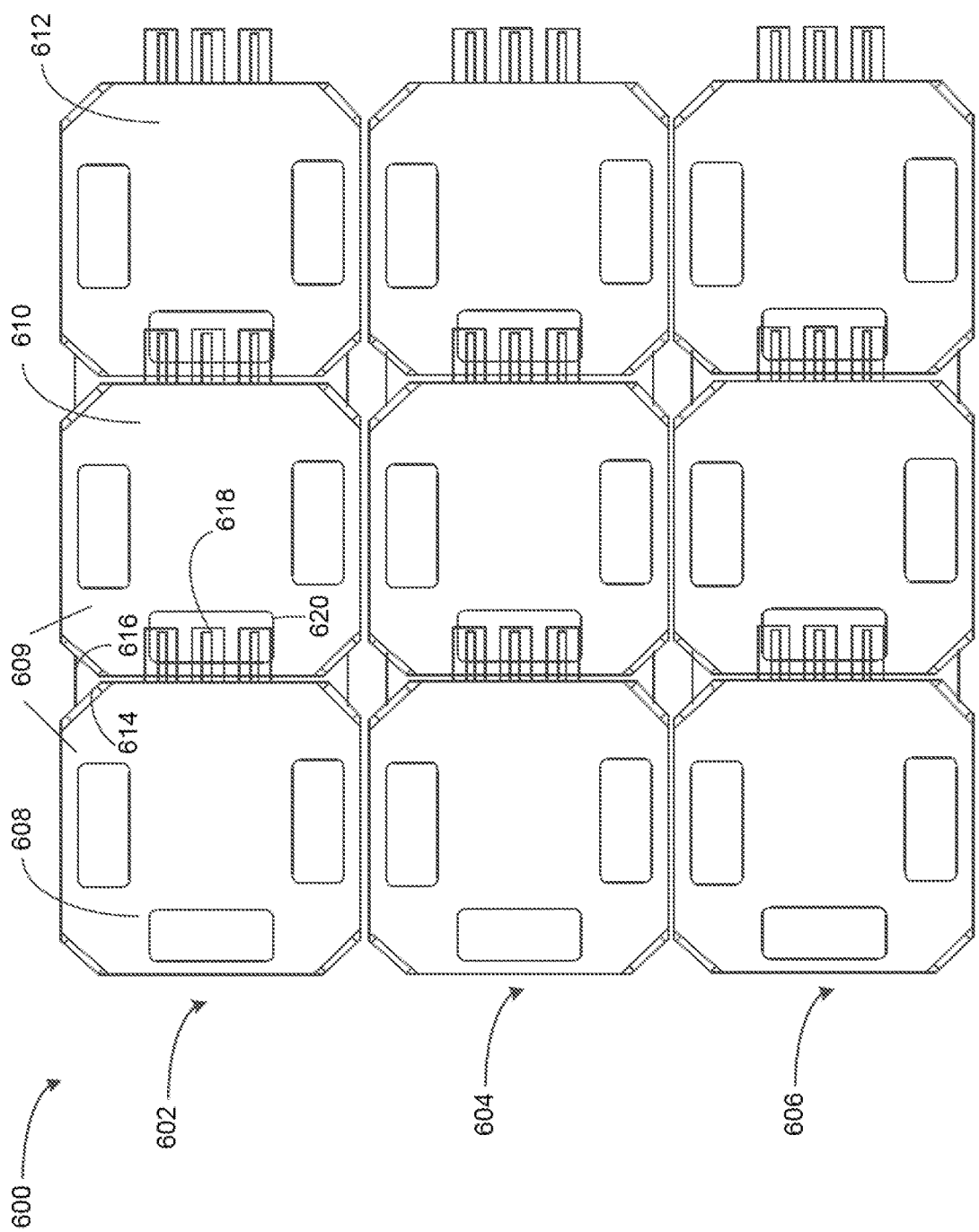
FIG. 6 illustrates a system of solar cells, according to an example implementation.

FIG. 6 illustrates a system 600 of solar cells, according to an example implementation. The system 600 includes a plurality of solar strings, including a first solar string 602, a second solar string 604, and a third solar string 606. The first solar string includes a first solar cell assembly 608, a second solar cell assembly 610, and a third solar cell assembly 612. Aspects of the solar cell assemblies are omitted for purposes of simplicity Each solar cell assembly in the system 600 may be configured similarly to the solar cell assembly 100 illustrated in FIGS. 1A and 1B. For example, each solar cell assembly includes a solar cell 106 having a solar-facing surface 108 and a non-solar-facing surface 109. The solar cell includes a cell corner. Each solar cell assembly further includes a flexible circuit 110 coupled to the non-solar-facing surface 109 of the solar cell 106, and the flexible circuit 110 is substantially coextensive with the solar cell 106. The flexible circuit 110 includes a flexible insulator including a plurality of edges 111 aligned with the solar cell 106, a flexible corner 112 extending past the cell corner, and a flexible tab extending from an edge of the plurality of edges 111. The flexible circuit 110 further includes a circuit substantially embedded in the flexible insulator, and the circuit includes a first electric contact exposed at a solar-facing side of the flexible corner, and a second electric contact exposed at a solar-facing side of the flexible tab.

FIG. 6 includes at least one pair of adjacent solar cell assemblies. The pair 609 includes a first solar cell assembly 608 that is electrically coupled to a second solar cell assembly 610 via a first electric contact 614 and a second electric contact 618. For example, as shown in FIG. 6, the first electric contact 614 can be connected to the second solar cell assembly 610 via an interconnect 616 that electrically couples the first electric contact to a corresponding contact on the adjacent solar cell, and the second electric contact 618 can be connected via a space 620 in a flexible insulator of the second solar cell assembly 610.

As depicted in FIG. 6, the second solar cell assembly 610 is connected to the third solar cell assembly 612 to complete the first solar string 602. The second solar string 604 and the third solar string 606 are configured in a similar manner to the first solar string. However, as shown in FIG. 6, each solar cell assembly could be connected to one another to form a single source of solar power. Accordingly, the system 600 can be adaptably and quickly assembled by an end user rather than requiring a specialized manufacturing facility.

Thus, the example systems, solar cell assemblies, and flexible circuits described herein provide allow for quick, adaptive, and reliable assembly of a solar cell system, and may reduce manufacturing costs while also providing a way to assemble the solar cell system at a convenient location for an end user. Further, having modular solar cell assemblies allows for simplified changes to the system in reconfiguration contexts. Still further, including substantially all of the electric circuit components of the solar cell system in flexible circuits embedded in the solar cell assemblies reduces the required number of parts of the system, and also allows for pre-assembly testing and troubleshooting. This may particularly impactful in space applications, where welding or soldering is impracticable. Still further, including a flexible circuit on a non-solar-facing side of the solar cell system reduces shadowing and allows for shorter electric leads thereby reducing resistive losses on the solar-facing side of the solar cell system.

By the term "substantially," "similarity," and "about" used herein, it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

Different examples of the system(s), device(s), and method(s) disclosed herein include a variety of components, features, and functionalities. It should be understood that the various examples of the system(s), device(s), and method(s) disclosed herein may include any of the components, features, and functionalities of any of the other examples of the system(s), device(s), and method(s) disclosed herein in any combination or any sub-combination, and all of such possibilities are intended to be within the scope of the disclosure.

The description of the different advantageous arrangements has been presented for purposes of illustration and description, and is not intended to be exhaustive or limited to the examples in the form disclosed. Many modifications and variations will be apparent to those of ordinary skill in the art. Further, different advantageous examples may describe different advantages as compared to other advantageous examples. The example or examples selected are chosen and described in order to best explain the principles of the examples, the practical application, and to enable others of ordinary skill in the art to understand the disclosure for various examples with various modifications as are suited to the particular use contemplated.

What is claimed is:

1. A solar cell assembly comprising:
a solar cell having a solar-facing surface and a non-solar-facing surface, the solar cell comprising a cell corner;
a flexible circuit coupled to the non-solar-facing surface of the solar cell, wherein the flexible circuit is substantially coextensive with the solar cell, the flexible circuit comprising:
a flexible insulator comprising a top insulating layer and a bottom insulating layer that form a plurality of edges aligned with the solar cell, a flexible corner extending past the cell corner, and a flexible tab extending from an edge of the plurality of edges; and
a circuit substantially embedded in between the top insulating layer and the bottom insulating layer of the flexible insulator, wherein the circuit comprises a first electric contact exposed and extending beyond the top insulating layer of the flexible insulator and along the bottom insulating layer of the flexible insulator at a solar-facing side of the flexible corner, and a second electric contact exposed at a solar-facing side of the flexible tab, a section of the top insulating layer, a section of the first electric contact, and a section of the bottom insulating layer of the flexible corner being configured to bend and invert such that the first electric contact couples to one or more electric leads on the solar-facing surface of the solar cell.

2. The solar cell assembly of claim 1, wherein the flexible insulator comprises an opening that exposes a portion of the non-solar-facing surface of the solar cell, wherein the opening is configured to accept an adjacent flexible tab of an adjacent solar cell assembly.

3. The solar cell assembly of claim 2, wherein the opening is a first opening of a plurality of openings, and wherein each opening corresponds to a different edge of the flexible insulator.

4. The solar cell assembly of claim 1, wherein the circuit further comprises a bypass diode for the solar cell, wherein the flexible insulator comprises a bottom layer and a top layer, wherein the top layer is coupled to the non-solar-facing surface of the solar cell, wherein the top layer comprises an opening, and wherein the bypass diode contacts the non-solar-facing surface of the solar cell via the opening.

5. The solar cell assembly of claim 1, wherein the circuit further comprises a bypass diode for the solar cell, wherein the first electric contact is connected to the bypass diode, and wherein the bypass diode contacts a non-solar-facing surface of another solar cell via the second electric contact.

6. The solar cell assembly of claim 1, wherein the solar cell is square with four cropped cell corners, wherein the flexible circuit is square with four cropped flexible corners, and wherein the cropped flexible corners of the flexible circuit each extend past the cropped cell corners of the solar cell.

7. The solar cell assembly of claim 1, wherein the flexible tab is a first flexible tab of a plurality of tabs, wherein the first flexible tab is associated with a bypass diode of the circuit, wherein a second flexible tab of the plurality of tabs is configured to provide a current path between the solar cell and an adjacent solar cell, and wherein each of the plurality of tabs extends from a same edge of the flexible insulator.

8. The solar cell assembly of claim 1, wherein the flexible insulator comprises a Polyimide material.

9. The solar cell assembly of claim 1, wherein the solar-facing surface of the solar cell comprises a center portion, and wherein a plurality of electric leads extend from the center portion towards the first electric contact.

10. A flexible circuit for a solar cell assembly comprising:
a flexible insulator comprising:
a top insulating layer;
a bottom insulating layer;
a plurality of edges, wherein the plurality of edges are configured to align with a solar cell such that the flexible insulator is coextensive with the solar cell;
a flexible corner, wherein the flexible corner is configured to extent past a cell corner of the solar cell; and
a flexible tab extending from an edge of the plurality of edges; and
a circuit substantially embedded in between the top insulating layer and the bottom insulating layer of the flexible insulator, wherein the circuit comprises a first electric contact exposed and extending beyond the top insulating layer and along the bottom insulating layer at a solar-facing side of the flexible corner, and a second electric contact exposed at a solar-facing side of the flexible tab, a section of the top insulating layer, a section of the first electric contact, and a section of the bottom insulating layer of the flexible corner being configured to bend and invert such that the first electric contact couples to one or more electric leads on a solar-facing surface of the solar cell.

11. The flexible circuit of claim 10, wherein the flexible insulator comprises an opening that exposes a portion of a non-solar-facing surface of the solar cell, wherein the opening is configured to accept an adjacent flexible tab of an adjacent flexible circuit.

12. The flexible circuit of claim 11, wherein the opening is a first opening of a plurality of openings, and wherein each opening corresponds to a different edge of the flexible insulator.

13. The flexible circuit of claim 10, wherein the circuit further comprises a bypass diode for the solar cell, wherein the flexible insulator comprises a bottom layer and a top layer, wherein the top layer is configured to couple to a non-solar-facing surface of the solar cell, wherein the top layer comprises an opening, and wherein the bypass diode is configured to contact the non-solar-facing surface of the solar cell via the opening.

14. The flexible circuit of claim 10, wherein the circuit further comprises a bypass diode for the solar cell, wherein the first electric contact is connected to the bypass diode, and wherein the bypass diode is configured to contact a non-solar-facing surface of another solar cell via the second electric contact.

15. The flexible circuit of claim 10, wherein the flexible insulator is rectangular with four cropped flexible corners.

16. The flexible circuit of claim 10, wherein the flexible tab is a first flexible tab of a plurality of tabs, wherein the first flexible tab is associated with a bypass diode of the circuit, wherein a second flexible tab of the plurality of tabs is configured to provide a current path between the solar cell and an adjacent solar cell, and wherein each of the plurality of tabs extends from a same edge of the flexible insulator.

17. A system of solar cells comprising:
a plurality of solar cell assemblies, each solar cell assembly comprising:
a solar cell having a solar-facing surface and a non-solar-facing surface, the solar cell comprising a cell corner;
a flexible circuit coupled to the non-solar-facing surface of the solar cell, wherein the flexible circuit is substantially coextensive with the solar cell, the flexible circuit comprising:
a flexible insulator comprising a top insulating layer and a bottom insulating layer that form a plurality of edges aligned with the solar cell, a flexible corner extending past the cell corner, and a flexible tab extending from an edge of the plurality of edges; and
a circuit substantially embedded in between the top insulating layer and the bottom insulating layer of the flexible insulator, wherein the circuit comprises a first electric contact exposed and extending beyond the top insulating layer of the flexible insulator and along the bottom insulating layer of the flexible insulator at a solar-facing side of the flexible corner, and a second electric contact exposed at a solar-facing side of the flexible tab, a section of the top insulating layer, a section of the first electric contact, and a section of the bottom insulating layer of the flexible corner being configured to bend and invert such that the first electric contact couples to one or more electric leads on the solar-facing surface of the solar cell,
wherein the plurality of solar cells assemblies comprises at least one pair of adjacent solar cell assemblies comprising a first solar cell assembly electrically coupled to a second solar cell assembly via the first electric contact and the second electric contact.

18. The system of claim 17, wherein the flexible tab is a first flexible tab of a plurality of tabs, wherein the first flexible tab is associated with a bypass diode of the circuit, wherein a second flexible tab of the plurality of tabs is configured to provide a current path between the solar cell and an adjacent solar cell, and wherein each of the plurality of tabs extends from a same edge of the flexible insulator.

19. The system of claim 17, wherein the flexible insulator comprises an opening that exposes a portion of the non-solar-facing surface of the solar cell, wherein the opening is configured to accept an adjacent flexible tab of an adjacent solar cell assembly.

20. The solar cell assembly of claim 1, the solar cell comprising a lateral surface that is between the solar-facing surface and the non-solar-facing surface and that intersects the solar-facing surface and the non-solar-facing surface, wherein the section of the top insulating layer, the section of the first electric contact, and the section of the bottom insulating layer do not contact the lateral surface.

* * * * *